US006700078B2

(12) United States Patent
Farquhar et al.

(10) Patent No.: US 6,700,078 B2
(45) Date of Patent: Mar. 2, 2004

(54) FORMATION OF MULTISEGMENTED PLATED THROUGH HOLES

(75) Inventors: Donald S. Farquhar, Endicott, NY (US); Robert M. Japp, Vestal, NY (US); John M. Lauffer, Waverly, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/176,254

(22) Filed: Jun. 19, 2002

(65) Prior Publication Data

US 2002/0164468 A1 Nov. 7, 2002

Related U.S. Application Data

(62) Division of application No. 09/764,464, filed on Jan. 17, 2001, now Pat. No. 6,426,470.

(51) Int. Cl.$^7$ ................................................. H05K 1/16
(52) U.S. Cl. ........................ 174/262; 174/255; 174/266; 361/795
(58) Field of Search ................................ 174/262, 255, 174/260, 261, 266, 264; 361/793, 795; 29/852, 830, 846

(56) References Cited

U.S. PATENT DOCUMENTS

| 3,932,932 A | * | 1/1976 | Goodman ................ 29/852 |
| 4,100,037 A | | 7/1978 | Baron et al. |
| 4,622,108 A | | 11/1986 | Polakovic et al. |
| 4,791,248 A | | 12/1988 | Oldenettel |
| 5,208,068 A | | 5/1993 | Davis et al. |
| 5,421,083 A | | 6/1995 | Suppelsa et al. |
| 5,590,029 A | | 12/1996 | Estes |
| 5,613,858 A | | 3/1997 | Estes et al. |
| 5,626,736 A | | 5/1997 | Florio et al. |
| 5,699,613 A | | 12/1997 | Chong et al. |
| 5,738,776 A | | 4/1998 | Florio et al. |
| 5,819,401 A | * | 10/1998 | Johannes et al. ............. 29/830 |
| 5,879,787 A | | 3/1999 | Petefish |
| 6,013,588 A | | 1/2000 | Ozaki |
| 6,073,344 A | | 6/2000 | Japp et al. |
| 6,159,586 A | | 12/2000 | Inoue et al. |
| 6,448,509 B1 | * | 9/2002 | Huemoeller ................ 174/262 |

FOREIGN PATENT DOCUMENTS

JP      404354180 A      12/1992

* cited by examiner

*Primary Examiner*—Kamand Cuneo
*Assistant Examiner*—I B Patel
(74) *Attorney, Agent, or Firm*—Schmeiser, Olsen & Watts; Arthur J. Samodovitz

(57) ABSTRACT

A method and structure relating to multisegmented plated through holes. A substrate includes a dielectric layer sandwiched between a first laminate layer and a second laminate layer. A through hole is formed through the substrate. The through hole passes through nonplatable dielectric material within the dielectric layer. As a result, subsequent seeding and electroplating of the through hole results in a conductive metal plating forming at a wall of the through hole on a segment of the first laminate layer and on a segment of the second laminate layer, but not on the nonplatable dielectric material of the dielectric layer. Thus, the conductive metal plating is not continuous from the first laminate layer to the second laminate layer.

11 Claims, 10 Drawing Sheets

FORMATION OF MULTISEGMENTED PLATED THROUGH HOLES

This application is a divisional of Ser. No. 09/764,464, filed on Jan. 17, 2001 U.S. Pat. No. 6,426,470.

BACKGROUND OF THE INVENTION

1. Technical Field

The present invention relates to plated through holes and more particularly to a method and structure for forming multisegmented plated through holes.

2. Related Art

A plated through hole (PTH) in a printed circuit board (PCB) provides electrical communication between a first electrically conductive structure electrically coupled to a first portion of the PTH and a second electrically conductive structure electrically coupled to a second portion of the PTH. Unfortunately, constraining the electrical coupling of such conductive structure to the first and second portions of the PTH limits the wiring density that can be achieved in the PCB.

There is a need to utilize a PTH in a substrate in a manner that facilitates increased wiring density in the PCB.

SUMMARY OF THE INVENTION

The present invention provides a method for forming at least one multisegmented plated through hole (PTH) in a substrate, comprising the steps of:

providing a first laminate having a dielectric layer and a second laminate having a dielectric layer;

forming a first selective plate core (SPC) by sandwiching a dielectric layer between a first metal layer and a second metal layer, wherein the dielectric layer of the first SPC includes a nonplatable dielectric material;

forming the substrate by sandwiching the first SPC between the first laminate and the second laminate;

forming a first through hole through the substrate; and metalizing a wall of the first through hole to form a first PTH of the at least one PTH, resulting in a metal plating on the first PTH that: plates to the first laminate, plates to the second laminate, does not plate to the first SPC, and is not continuous from the first laminate to the second laminate.

The present invention provides a method for forming at least one multisegmented plated through hole (PTH) in a substrate, comprising the steps of:

providing a first laminate having a dielectric layer and a second laminate having a dielectric layer;

forming a first selective plate core (SPC) by sandwiching a dielectric layer between a first metal layer and a second metal layer such that the dielectric layer of the first SPC includes a platable dielectric material, forming a hole through the first SPC, and filling the hole with a nonplatable dielectric material to form a plug within the hole;

forming the substrate by sandwiching the first SPC between the first laminate and the second laminate;

forming a first through hole through the substrate such that the first through hole passes through the plug resulting in a cylindrical segment of the nonplatable dielectric material circumscribing a portion of the first through hole; and metalizing a wall of the first through hole to form a first PTH of the at least one PTH, resulting in a metal plating on the first PTH that: plates to the first laminate, plates to the second laminate, does not plate to the first SPC, and is not continuous from the first laminate to the second laminate.

The present invention provides an electrical structure, comprising:

a substrate including a first selective plate core (SPC) sandwiched between a first laminate and a second laminate, wherein the first laminate includes a dielectric layer, wherein the second laminate includes a dielectric layer, and wherein the first SPC comprises a dielectric layer having a nonplatable dielectric material;

a first through hole through the substrate, wherein a metal plating on a wall of the first through hole: is plated to the first laminate, is plated to the second laminate, is not plated to the first SPC, and is not continuous from the first laminate to the second laminate.

The present invention provides an electrical stricture, comprising:

a substrate including a first selective plate core (SPC) sandwiched between a first laminate and a second laminate, wherein the first laminate includes a dielectric layer, wherein the second laminate includes a dielectric layer, wherein the first SPC includes a dielectric layer having a dielectric material that is platable, wherein the first SPC further includes a cylindrical segment of a dielectric material that is nonplatable, and wherein the cylindrical segment extends through a total thickness of the first SPC; and a first through hole through the substrate, wherein the cylindrical segment circumscribes a portion of the first through hole, and wherein a metal plating on a wall of the first through hole: is plated to the first laminate, is plated to the second laminate, is not plated to the first SPC, and is not continuous from the first laminate to the second laminate.

The present invention provides a method and structure for utilizing a PTH in a substrate in a manner that facilitates an increased wiring density in the substrate.

DETAILED DESCRIPTION OF THE INVENTION

Embodiments of the present invention are disclosed herein. First embodiments are depicted in FIGS. 1–9. Second embodiments are depicted in FIGS. 10–15.

Figure 1:
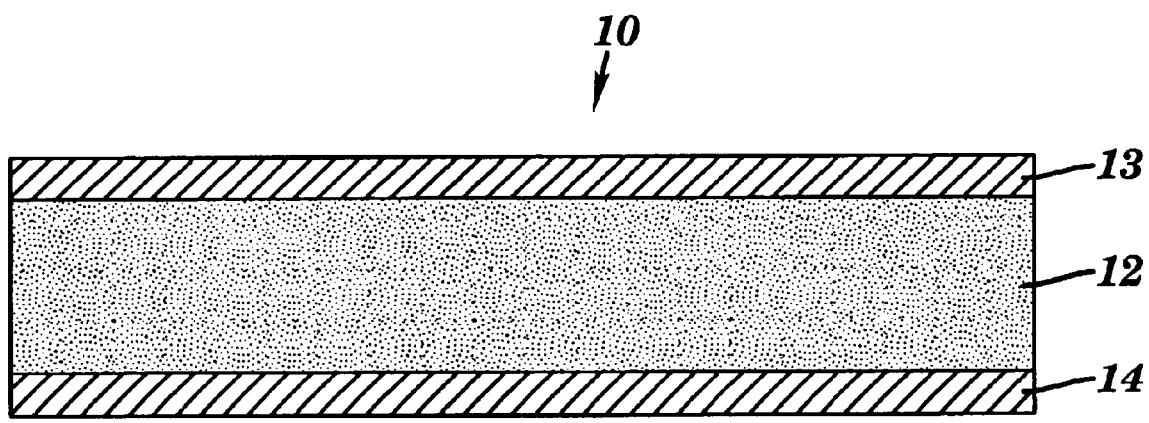
FIG. 1 depicts a front cross-sectional view of a selective plate core (SPC) comprising a nonplatable dielectric layer sandwiched between two metal layers, in accordance with embodiments of the present invention.

In relation to the first embodiments of the present invention, FIG. 1 illustrates a front cross-sectional view of a selective plate core (SPC) 10 in an initial stage of its formation. The SPC 10 comprises a nonplatable dielectric layer 12 sandwiched between metal layers 13 and 14, in accordance with embodiments of the present invention. The metal layers 13 and 14 may each include, inter alia, copper. The nonplatable dielectric layer 12 includes a nonplatable dielectric material that is nonplatable with respect to a seeding process and an electrically conductive metal plating process. That is, the nonplatable dielectric material cannot be electroplated by the seeding process followed by electroplating by the electrically conductive plating process, for any reason including the following two reasons. The first reason is that the nonplatable dielectric material cannot be seeded with a seeding material associated with the seeding process. The second reason is that, although the nonplatable dielectric material can be seeded with the seeding material, the nonplatable dielectric material cannot be electroplated with electrically conductive metal plating material of the metal plating process following the seeding. The nonplatable dielectric layer 12 may include, inter alia, a prepreg. The nonplatable dielectric material may include, inter alia, a fluoropolymer-glass material, a fluoropolymer-ceramic material, a fluorinated epoxy material, a low surface energy thermoplastic material such as polyethylene, etc.

Figure 2:
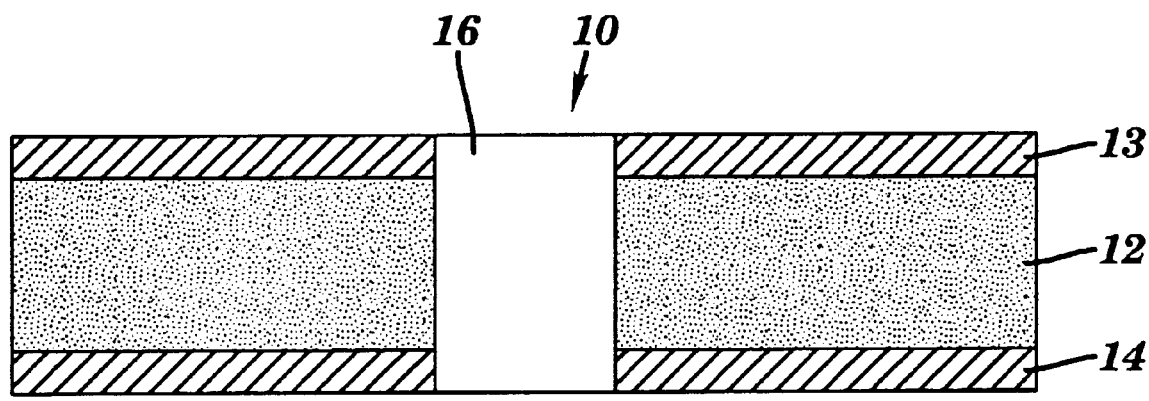
FIG. 2 depicts FIG. 1 after a hole has been formed through the SPC.

FIG. 2 illustrates FIG. 1 after a hole 16 has been formed through the SPC 10. The hole 16 may be formed by any method known to one of ordinary skill in the art such as by, inter alia, laser drilling or mechanical drilling.

Figure 3:
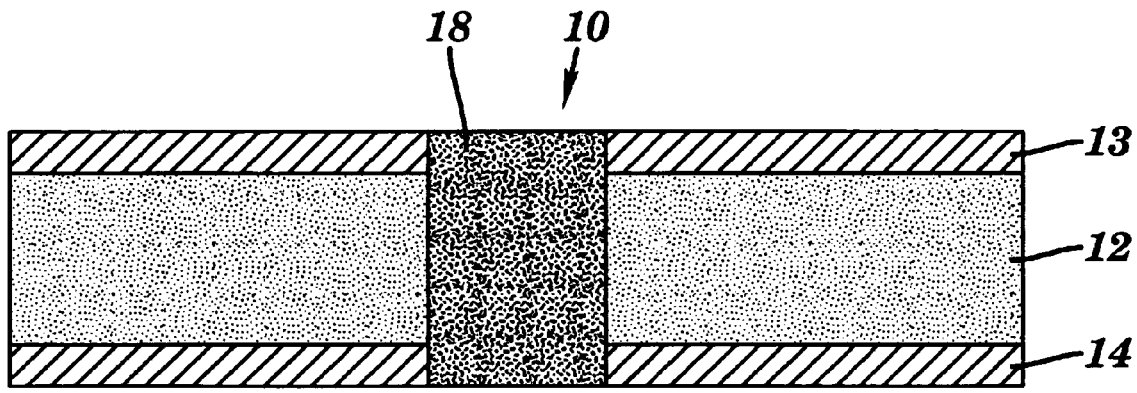
FIG. 3 depicts FIG. 2 after the hole has been filled with a platable dielectric material.

FIG. 3 illustrates FIG. 2 after the hole 16 has been filled with platable dielectric material to form a plug 18. The platable dielectric material can be electroplated by the process of seeding with the seeding material followed by the process of electroplating with the electrically conductive metal plating material. The platable dielectric material may include, inter alia, an epoxy resin, polyimide, BT-epoxy, cyanate ester, and other thermoset resins. Any of the aforementioned platable dielectric materials may optionally contain various inorganic or organic particulate fillers, or fiber reinforcements, etc. As will be seen in the discussion infra of FIG. 9, a through hole may pass through the plug 18. Since the plug 18 includes the platable dielectric material, subsequent seeding and electroplating of the through hole will form an electrically conductive plating on the platable dielectric material that exists on the wall of the through hole. In contrast, a seeding and electroplating of a through hole passing through the nonplatable dielectric layer 12, at a location where there is no plug of platable dielectric material, will not form a conductive plating on the nonplatable dielectric material.

Figure 4:
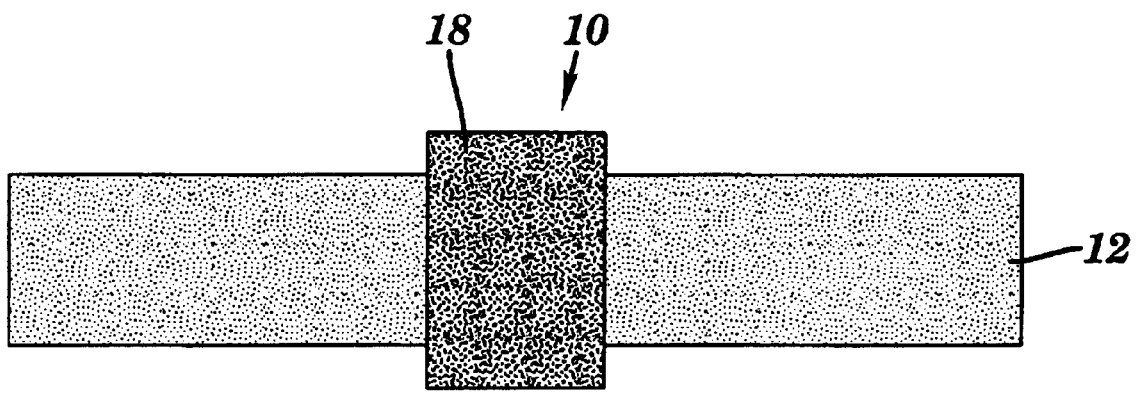
FIG. 4 depicts FIG. 3 after the two metal layers have been removed from the SPC.

FIG. 4 illustrates FIG. 3 after the metal layers 13 and 14 have been optionally removed from the SPC 10 by any method known to one of ordinary skill in the art such as by, inter alia, chemical etching. While the metal layers 13 and 14 may be removed as shown in FIG. 4, it is also within the scope of the present invention not to remove the metal layers 13 and 14. The metal layers 13 and 14 may provide benefit in some applications. For example, circuit lines may be formed from the metal layers 13 and 14 in some applications but are not shown here in order to simply illustration.

Figure 5:
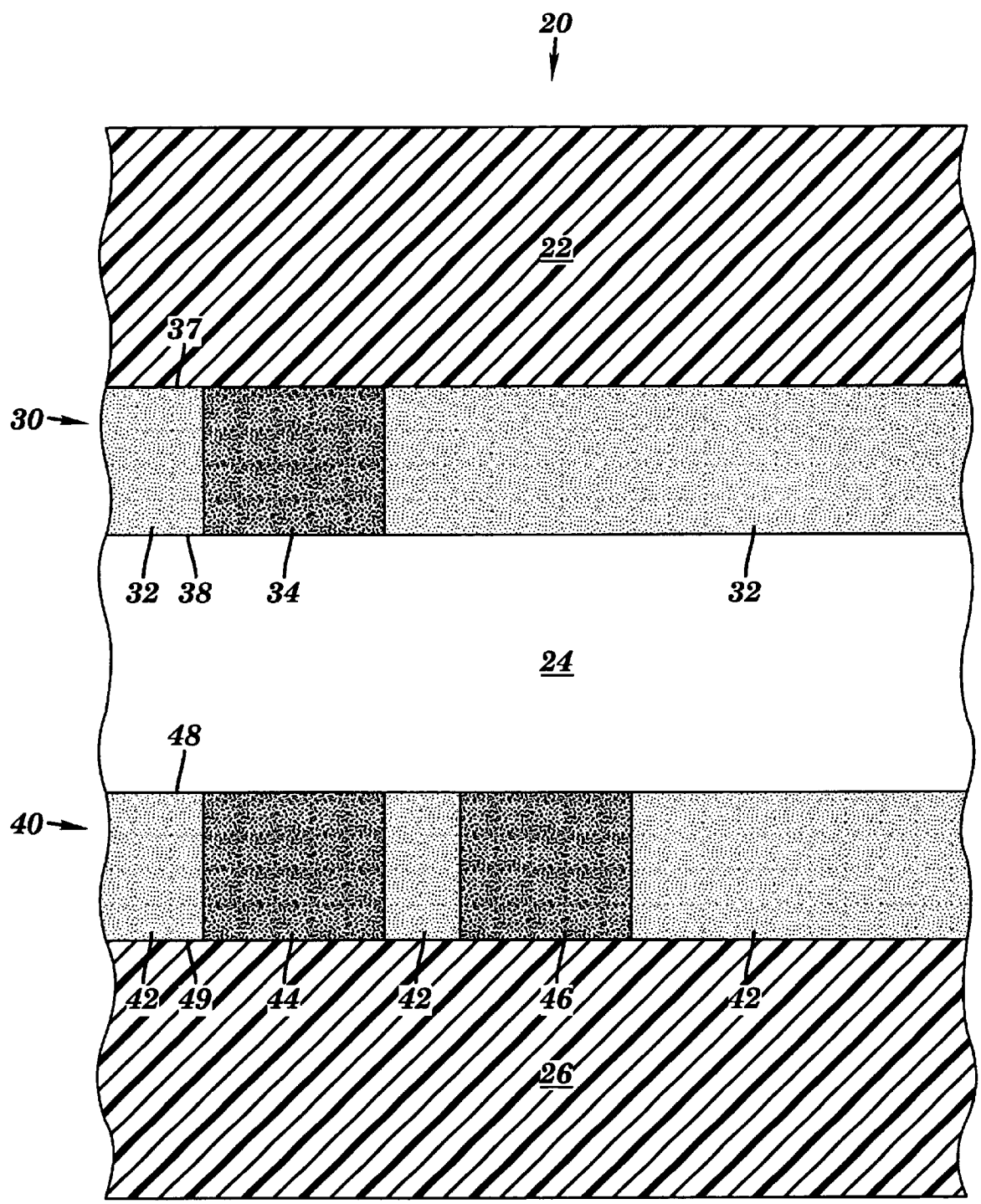
FIG. 5 depicts a front cross-sectional view of a substrate comprising a first dielectric laminate, a first SPC, a second dielectric laminate, a second SPC, and a third dielectric laminate, in accordance with embodiments of the present invention.

FIG. 5 illustrates a front cross-sectional view of a substrate 20 comprising, in accordance with embodiments of the present invention, a laminate 22 on a SPC 30, the SPC 30 on a laminate 24, the laminate 24 on a SPC 40, and the SPC 40 on a laminate 26. Thus, the SPC 30 is sandwiched between the laminate 22 and the laminate 24. Similarly, the SPC 40 is sandwiched between the laminate 24 and the laminate 26. The laminates 22, 24, and 26 are each platable with respect to the seeding process and the electrically conductive metal plating process. The substrate may include, inter alia, a printed circuit board (PCB).

The SPC 30 and the SPC 40 are each of the type shown in FIG. 4. The SPC 30 comprises a nonplatable dielectric layer 32 that includes a nonplatable dielectric material and a plug 34 of a platable dielectric material. The SPC 40 comprises a nonplatable dielectric layer 42 that includes a nonplatable dielectric material and plugs 44 and 46 each made of a platable dielectric material. The nonplatable dielectric layers 32 and 42 may include, inter alia, a prepreg. The nonplatable dielectric material of the dielectric layers 32 and 42 may each include, inter alia, a fluoropolymer-glass material, a fluoropolymer-ceramic material, or other composite materials which exhibit hydrophobicity or low surface energy, etc. The platable dielectric material of the plugs 34, 44, and 46 may each include, inter alia, an epoxy resin, or various other filled or unfilled moderate surface energy organic resin or composite materials, etc. Although the SPC 30 and the SPC 40 do not have metal layers such as the metal layers 13 and 14 of FIG. 3, it is within the scope of the present invention for either or both of the SPC 30 and the SPC 40 to have metal layers such as the metal layers 13 and 14 of FIG. 3.

Figure 6:
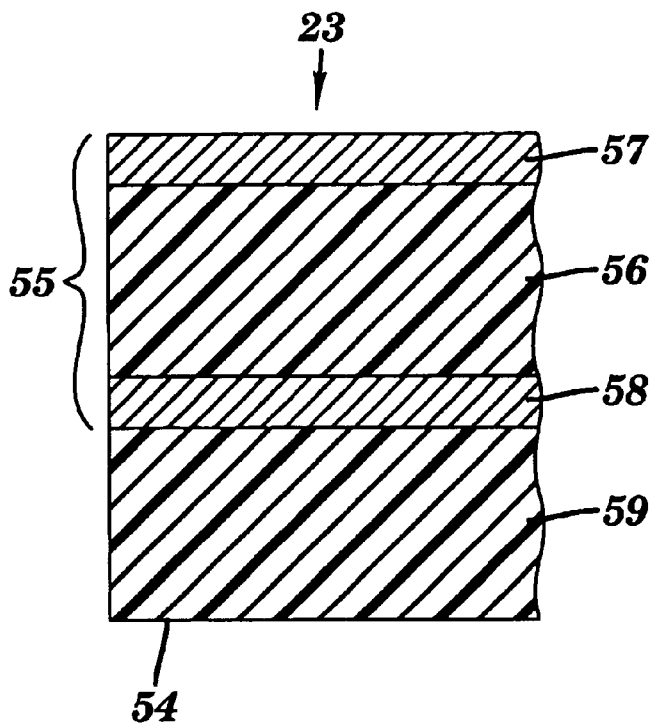
FIG. 6 depicts an example of the first dielectric laminate of FIG. 5.

In FIG. 5, the laminate 22 includes a dielectric layer and may include, inter alia, a prepreg as shown in FIG. 6. In FIG. 6, a laminate 23 exemplifies the laminate 22 of FIG. 5. The laminate 23 comprises a core 55 coupled to a prepreg 59. The core 55 includes a prepreg 56 sandwiched between metal layers 57 and 58. The metal layers 57 and 58 may each include, inter alia, copper. The prepregs 56 and 59 each include a platable dielectric material such as, inter alia, an epoxy resin, or epoxy/glass or various other PCB laminate materials, etc. Noting that the laminate 23 of FIG. 6 represents the laminate 22 of FIG. 5, a surface 54 of the prepreg 59 of FIG. 6 is in contact with a surface 37 of the SPC 30 of FIG. 5. In typical applications, the prepreg 59 is not coupled to the core 55 prior to composite lamination of the structure of the substrate 20 of FIG. 5, but is added the structure during such composite lamination in order to adhere the core 55 to the SPC 30.

Figure 7:
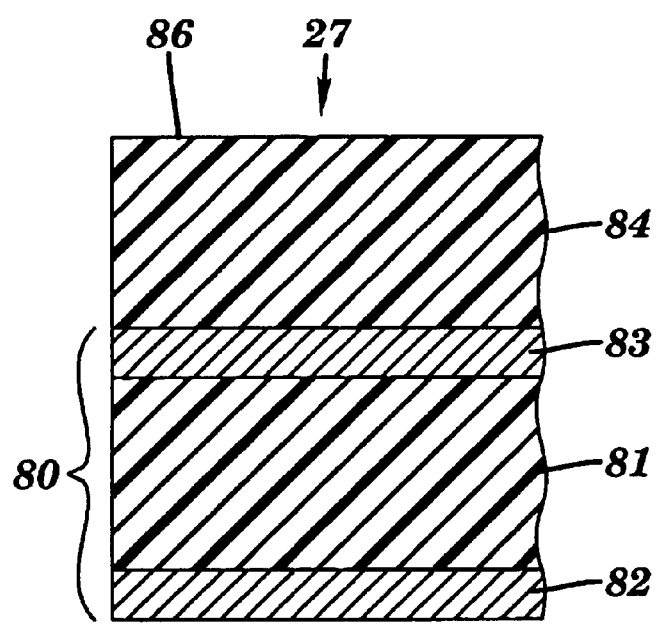
FIG. 7 depicts an example of the third dielectric laminate of FIG. 5.

In FIG. 5, the laminate 26 includes a dielectric layer and may include, inter alia, a prepreg as shown in FIG. 7. In FIG. 7, a laminate 27 exemplifies the laminate 26 of FIG. 5. The laminate 27 comprises a core 80 coupled to a prepreg 84. The core 80 includes a prepreg 81 sandwiched between metal layers 82 and 83. The metal layers 82 and 83 may each include, inter alia, copper. The prepregs 81 and 84 each include a platable dielectric material such as, inter alia, an epoxy resin, polyimide, BT-epoxy, cyanate ester, and other thermoset resins. Any of the aforementioned platable dielectric materials may optionally contain various inorganic or organic particulate fillers, or fiber reinforcements, etc. If the laminate 27 of FIG. 7 represents the laminate 26 of FIG. 5, then a surface 86 of the prepreg 84 of FIG. 7 is in contact with a surface 49 of the SPC 40 of FIG. 5.

Figure 8:
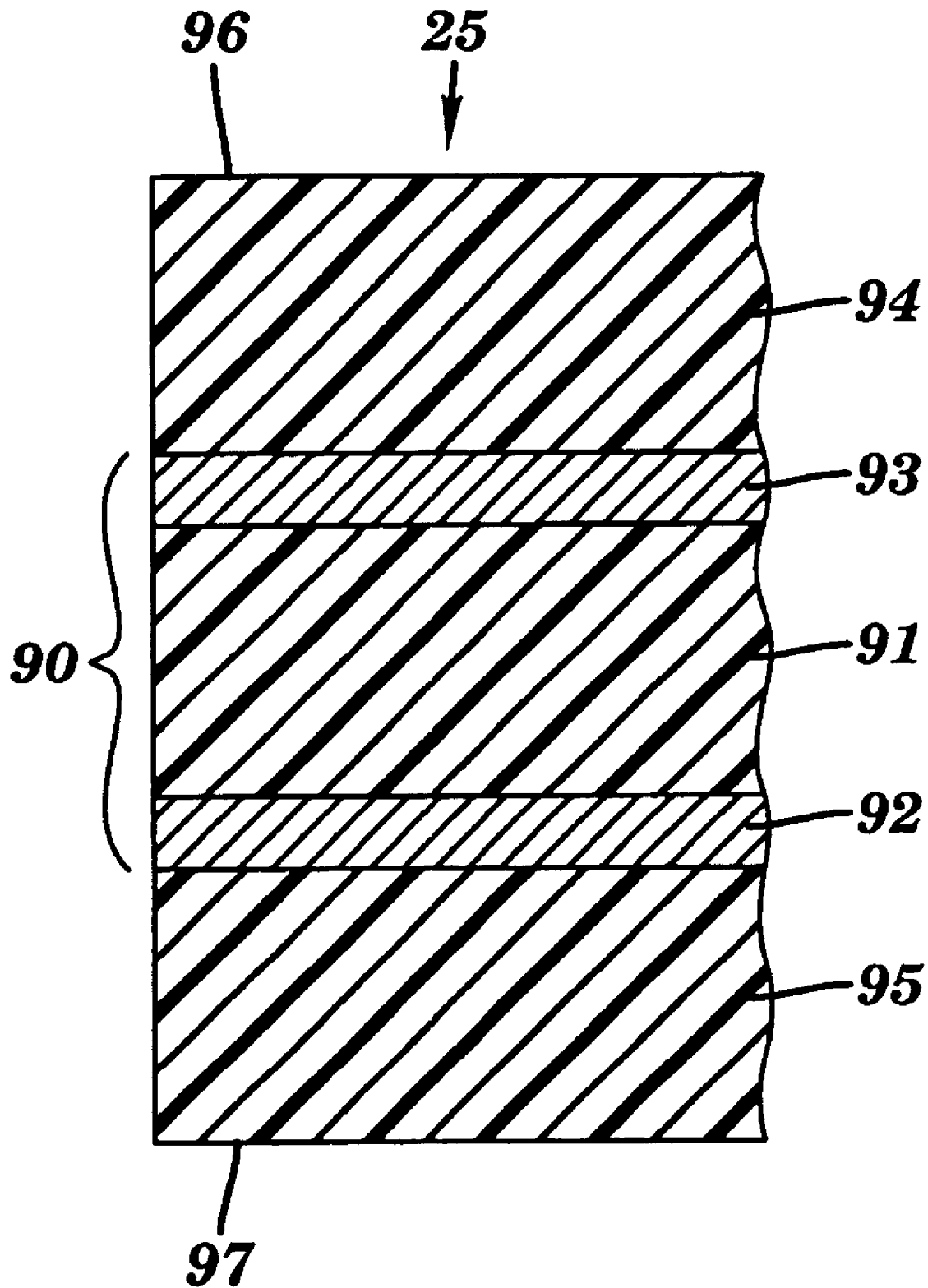
FIG. 8 depicts an example of the second dielectric laminate of FIG. 5.

In FIG. 5, the laminate 24 includes a dielectric layer and may include, inter alia, a prepreg as shown in FIG. 8. In FIG. 8, the laminate 25 exemplifies the laminate 24 of FIG. 5. The laminate 25 comprises a core 90 sandwiched between a prepreg 94 and a prepreg 95. The core 90 includes a prepreg 91 sandwiched between metal layers 92 and 93. The metal layers 92 and 93 may each include, inter alia, copper. The prepregs 91, 94, and 95 each include a platable dielectric material such as, inter alia, an epoxy resin, polyimide, BT-epoxy, cyanate ester, and other thermoset resins. Any of the aforementioned platable dielectric materials may optionally contain various inorganic or organic particulate fillers, or fiber reinforcements, etc. If the laminate 25 of FIG. 8 represents the laminate 24 of FIG. 5, then a surface 96 of the laminate 25 of FIG. 8 is in contact with the surface 38 of the SPC 30 of FIG. 5, and the surface 97 of the laminate 25 of FIG. 8 is in contact with the surface 48 of the SPC 40 of FIG. 5.

Figure 9:
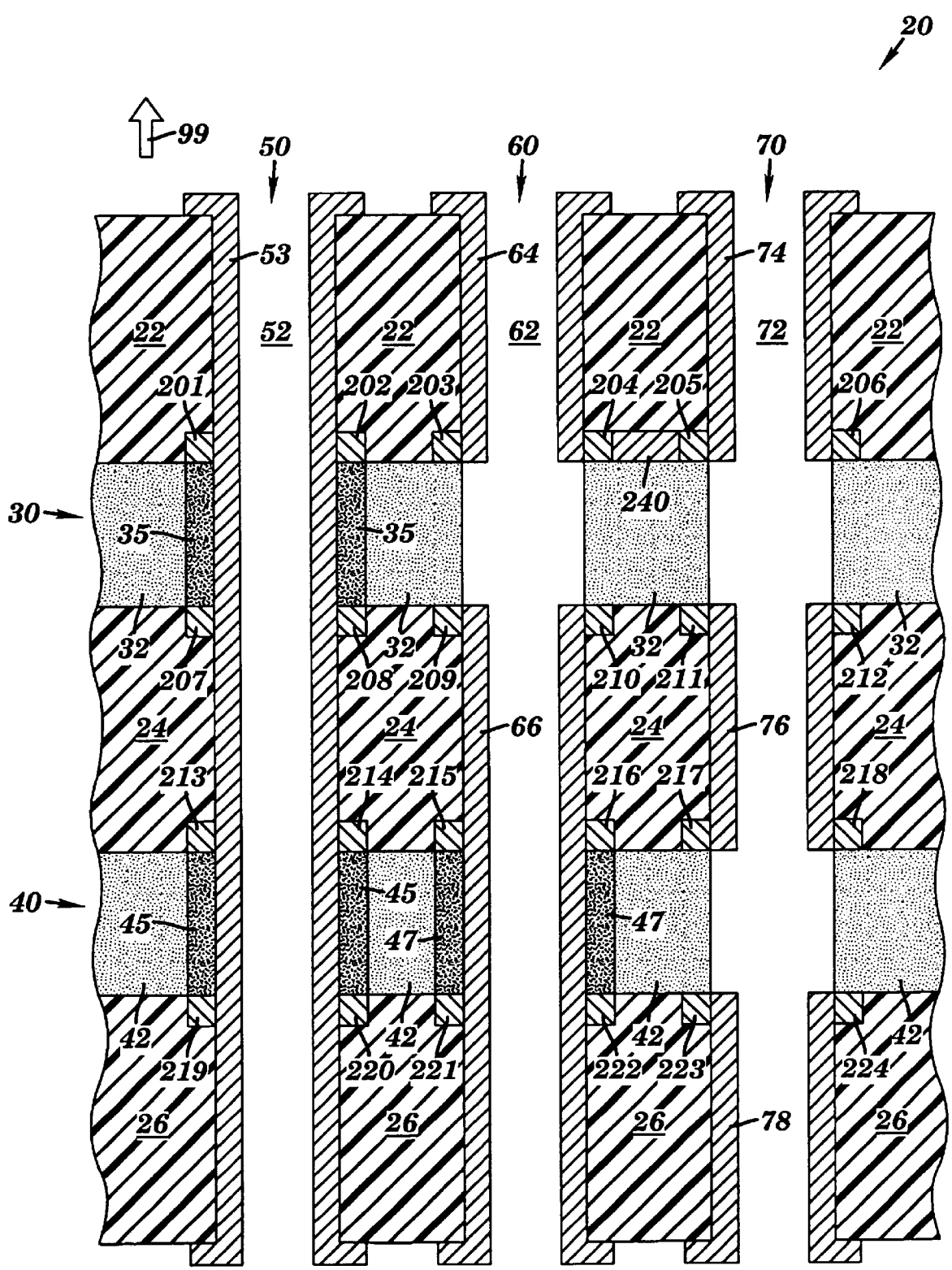
FIG. 9 depicts FIG. 5 after plated through holes through the SPC have been formed.

FIG. 9 illustrates FIG. 5 after plated through holes 52, 62, and 72 have been formed through the SPC 20. The through hole 52 passes through the platable dielectric material of the plugs 34 and 44 (see FIG. 5) to form cylindrical segments 35 and 45, respectively, of the platable dielectric material. The through hole 62 passes through the nonplatable dielectric material of the nonplatable dielectric layer 32, and through the platable dielectric material of the plug 46 (see FIG. 5) to form a cylindrical segment 47 of the platable dielectric material. The through hole 72 passes through the nonplatable dielectric material of the nonplatable dielectric layers 32 and 42, respectively.

The through holes 52, 62, and 72 are seeded by the seeding process and electroplated by the electrically conductive metal plating process, in any manner known to one of ordinary skill in the art, to form a plated though hole (PTH) 50, a PTH 60, and a PTH 70, respectively. The PTH 50 comprises a continuous plating 53. Since the cylindrical segments 35 and 45 each include platable dielectric material, the plating 53 plates to the cylindrical segments 35 and 45, and is continuous from the laminate 22 to the laminate 26.

The PTH 60 comprises a plating segment 64 and a plating segment 66. Since the nonplatable dielectric layer 32 includes nonplatable dielectric material, the electrically conductive plating material cannot plate to the nonplatable dielectric layer 32 in the through hole 62. Accordingly, the plating segment 64 is electrically isolated from the plating segment 66, and the plating in the through hole 62 is not continuous from the laminate 22 to the laminate 24. Nonetheless, since the cylindrical segment 47 includes platable dielectric material, the plating segment 66 plates to the cylindrical segment 47, and is continuous from the laminate 24 to the laminate 26.

The PTH 70 comprises plating segments 74, 76, and 78. Since the nonplatable dielectric layers 32 and 42 each includes nonplatable dielectric material, the electrically conductive plating material cannot plate to the nonplatable dielectric layers 32 and 42 in the through hole 72. Accordingly, the plating segment 74 is electrically isolated from the plating segment 76, and the plating in the through hole 72 is not continuous from the laminate 22 to the laminate 24. Similarly, the plating segment 76 is electrically isolated from the plating segment 78, and the plating in the through hole 72 is not continuous from the laminate 24 to the laminate 26.

FIG. 9 also shows lands 201–224. Although not explicitly shown, some or all of the lands 201–224 may be used to facilitate electrical connections within the substrate 20. As an example, an electrically conductive coupler 240 (e.g., electrically conductive wiring) electrically couples the land 204 to the land 205. Generally, any land may be electrically coupled to any other land or internal circuitry in the substrate 20.

Figure 10:
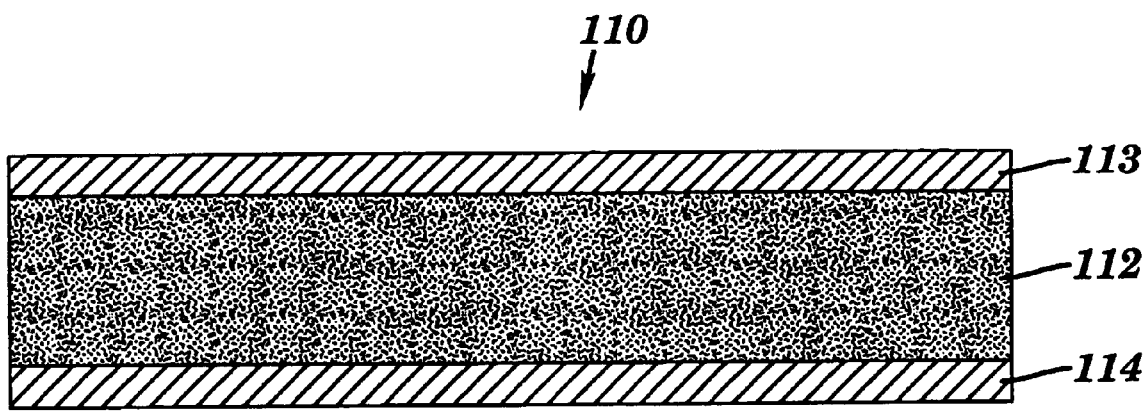
FIG. 10 depicts a front cross-sectional view of a selective plate core (SPC) comprising a platable dielectric layer sandwiched between two metal layers, in accordance with embodiments of the present invention.

In relation to the second embodiments of the present invention, FIG. 10 illustrates a front cross-sectional view of a selective plate core (SPC) 110 in an initial stage of its formation. The SPC 110 comprises a platable dielectric layer 112 sandwiched between metal layers 113 and 114, in accordance with embodiments of the present invention. The metal layers 113 and 114 may each include, inter alia, copper. The platable dielectric layer 112 includes a platable dielectric material that is platable with respect to a seeding material and a electrically conductive plating material. The platable dielectric layer 112 may include, inter alia, a prepreg. The platable dielectric material may include, inter alia, an epoxy resin, polyimide, BT-epoxy, cyanate ester, and other thermoset resins. Any of the aforementioned platable dielectric materials may optionally contain various inorganic or organic particulate fillers, or fiber reinforcements, etc.

Figure 11:
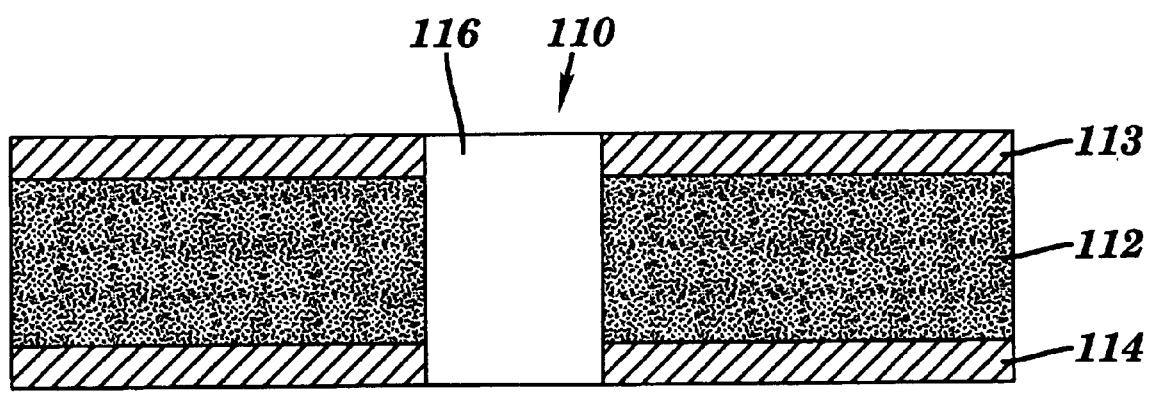
FIG. 11 depicts FIG. 10 after a hole has been formed through the SPC.

FIG. 11 illustrates FIG. 10 after a hole 116 has been formed through the SPC 110. The hole 116 may be formed by any method known to one of ordinary skill in the art such as by, inter alia, laser drilling or mechanical drilling.

Figure 12:
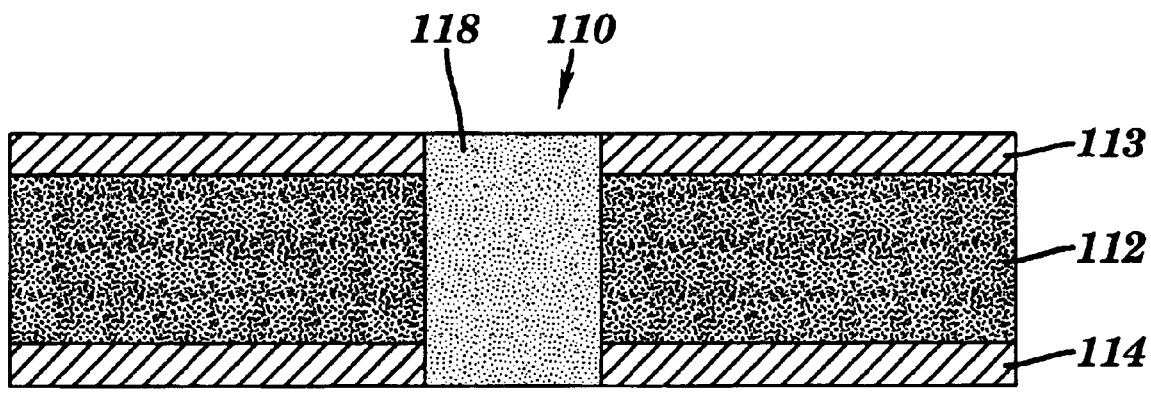
FIG. 12 depicts FIG. 11 after the hole has been filled with a nonplatable dielectric material.

FIG. 12 illustrates FIG. 11 after the hole 116 has been filled with nonplatable dielectric material to form a plug 118. The nonplatable dielectric material is nonplatable with respect to the seeding material and the electrically conductive plating material. The nonplatable dielectric material may include, inter alia, a fluoropolymer-glass material, a fluoropolymer-ceramic material, a fluorinated epoxy material, a low surface energy thermoplastic material such as polyethylene, etc. As will be seen in the discussion infra of FIG. 15, a through hole may pass through the plug 118. Since the plug 118 includes the nonplatable dielectric material, subsequent seeding and electroplating of the through hole will not form electrically conductive plating on the nonplatable dielectric material that exists on the wall of the through hole. In contrast, seeding and electroplating of a through hole passing through the platable dielectric layer 112, at a location where there is no plug of nonplatable dielectric material, will form electrically conductive plating on the platable dielectric layer 112.

Figure 13:
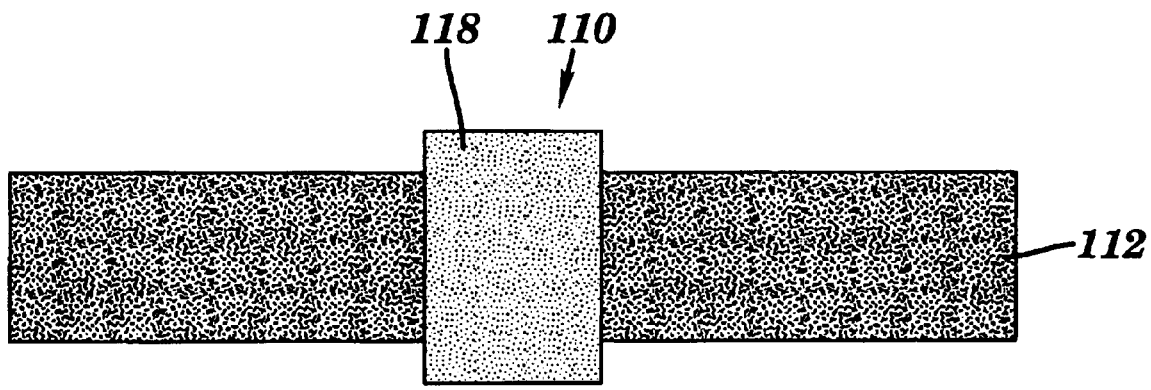
FIG. 13 depicts FIG. 12 after the two metal layers have been removed from the SPC.

FIG. 13 illustrates FIG. 12 after the metal layers 113 and 114 have been optionally removed from the SPC 110 by any method known to one of ordinary skill in the art such as by, inter alia, chemical etching. While the metal layers 113 and 114 may be removed as shown in FIG. 13, it is also within the scope of the present invention not to remove the metal layers 113 and 114. The metal layers 113 and 114 may provide benefit in some applications. For example, circuit lines may be formed from the metal layers 113 and 114 in some applications.

Figure 14:
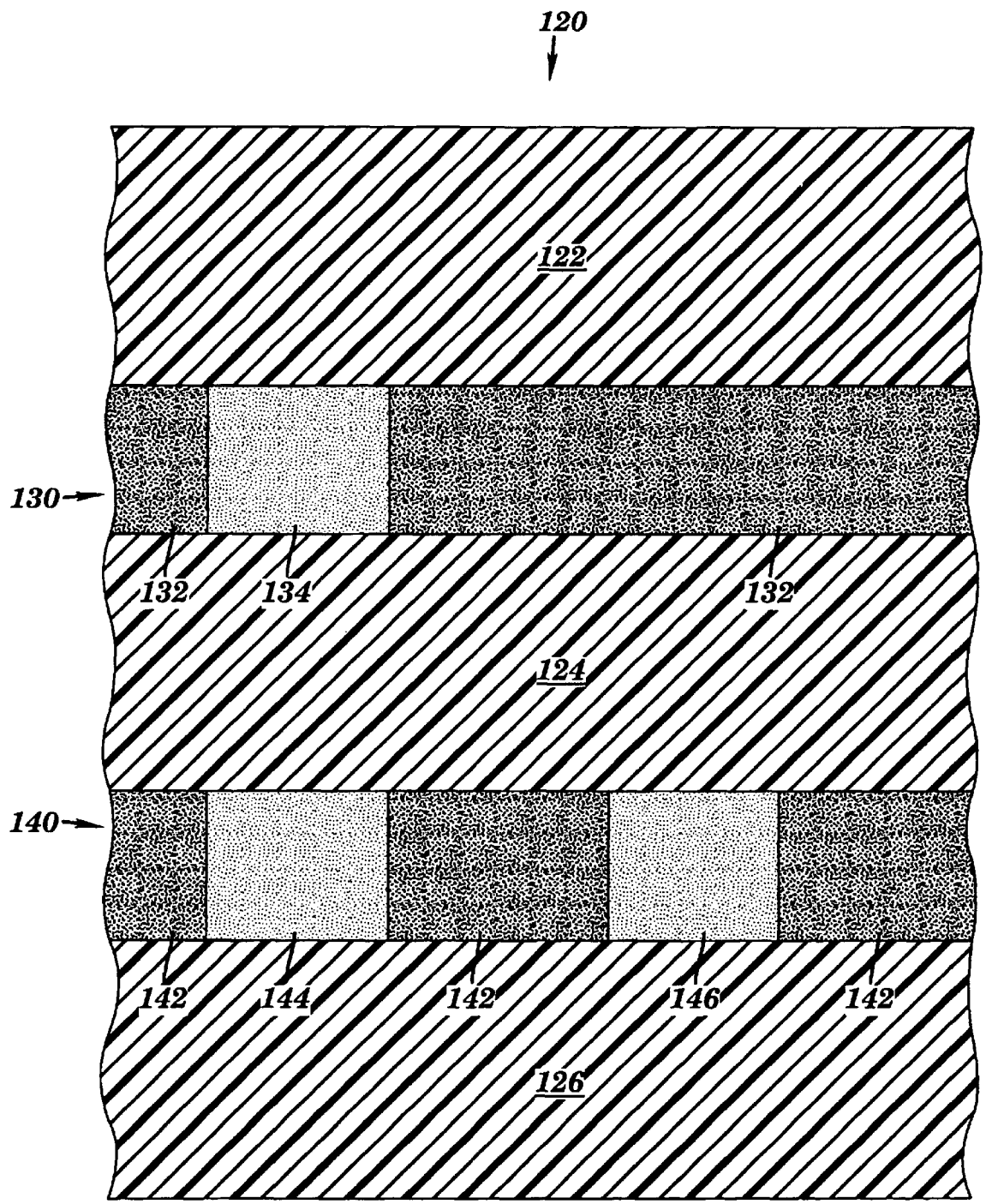
FIG. 14 depicts a front cross-sectional view of a substrate comprising a first dielectric laminate, a first SPC, a second dielectric laminate, a second SPC, and a third dielectric, in accordance with embodiments of the present invention.

FIG. 14 illustrates a front cross-sectional view of a substrate 120 comprising, in accordance with embodiments of the present invention, a laminate 122 on a SPC 130, the SPC 130 on a laminate 124, the laminate 124 on a SPC 140, and the SPC 140 on a laminate 126. Thus, the SPC 130 is sandwiched between the laminate 122 and the laminate 124. Similarly, the SPC 140 is sandwiched between the laminate 124 and the laminate 126. The laminates 122, 124, and 126 are each platable with respect to the seeding material and the electrically conductive plating process.

The SPC 130 and the SPC 140 are each of the type shown in FIG. 13. The SPC 130 comprises a platable dielectric layer 132 that includes a platable dielectric material and a plug 134 of a nonplatable dielectric material. The SPC 140 comprises a platable dielectric layer 142 that includes a platable dielectric material and plugs 144 and 146 each made of a nonplatable dielectric material. The platable dielectric layers 132 and 142 may include, inter alia, a prepreg. The platable dielectric material of the dielectric layers 132 and 142 may each include, inter alia, an epoxy resin, polyimide, BT-epoxy, cyanate ester, and other thermoset resins. Any of the aforementioned platable dielectric materials may optionally contain various inorganic or organic particulate fillers, or fiber reinforcements, etc. The nonplatable dielectric material of the plugs 134, 144, and 146 may each include, inter alia, a fluoropolymer-glass material, a fluoropolymer-ceramic material, a fluorinated epoxy material, a low surface energy thermoplastic material such as polyethylene, etc. Although the SPC 130 and the SPC 140 do not have metal layers such as the metal layers 113 and 114 of FIG. 12, it is within the scope of the present invention for either or both of the SPC 130 and the SPC 140 to have metal layers such as the metal layers 113 and 114 of FIG. 12.

In FIG. 14, the laminates 122, 124, and 126 each includes a dielectric layer and may include, inter alia, a prepreg. The laminates 23, 27, and 25 of FIGS. 6, 7, and 8, respectively, exemplify the laminates 122, 124, and 126 in the same manner, discussed supra, as the laminates 23, 27, and 25 exemplify the laminates 22, 24, and 26 of FIG. 5. For example, in accordance with the discussion supra in conjunction with FIG. 6, the prepreg 59 is not coupled to the core 55 prior to composite lamination of the structure of the substrate 120 of FIG. 14, but is added the structure during such composite lamination in order to adhere the core 55 to the SPC 130.

Figure 15:
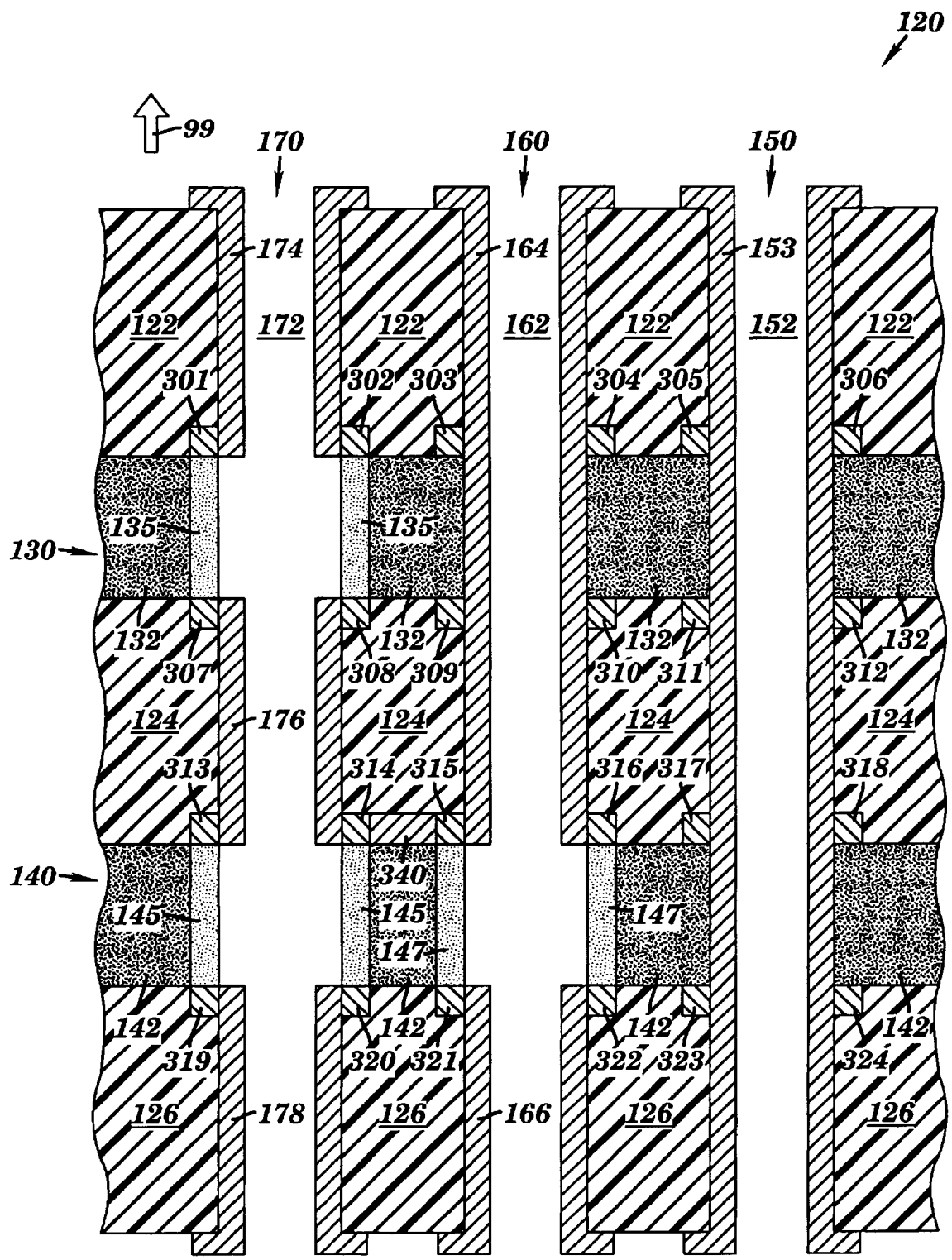
FIG. 15 depicts FIG. 14 after plated through holes through the SPC have been formed.

FIG. 15 illustrates FIG. 14 after plated through holes 172, 162, and 152 have been formed through the SPC 120. The through hole 172 passes through the nonplatable dielectric material of the plugs 134 and 144 (see FIG. 14) to form cylindrical segments 135 and 145, respectively, of the nonplatable dielectric material. The through hole 162 passes through the platable dielectric material of the platable dielectric layer 132, and through the nonplatable dielectric material of the plug 146 (see FIG. 14) to form a cylindrical segment 147 of the nonplatable dielectric material. The through hole 172 passes through the platable dielectric material of the platable dielectric layers 132 and 142, respectively.

The through holes 172, 162, and 152 are each seeded by the seeding process and electroplated by the electrically conductive metal plating process, in any manner known to one of ordinary skill in the art, to form a PTH 170, a PTH 160, and a PTH 150, respectively. The PTH 170 comprises plating segments 174, 176, and 178. Since the cylindrical segments 135 and 145 each include nonplatable dielectric material, the electrically conductive metal plating material cannot plate to the cylindrical segments 135 and 145 in the through hole 172. Accordingly, the plating segment 174 is electrically isolated from the plating segment 176, and the plating in the through hole 172 is not continuous from the laminate 122 to the laminate 124. Similarly, the plating segment 176 is electrically isolated from the plating segment 178, and the plating in the through hole 172 is not continuous from the laminate 124 to the laminate 126.

The PTH 160 comprises a plating segment 164 and a plating segment 166. Since the platable dielectric layer 132 includes platable dielectric material, the electrically conductive metal plating material plates to the platable dielectric layer 132 in the through hole 162. Accordingly, the plating segment 164 plates to the platable dielectric layer 132 and is continuous from the laminate 122 to the laminate 124. Since the cylindrical segment 147 includes nonplatable dielectric material, the electrically conductive plating material does not plate to the cylindrical segment 147 in the through hole 162. Thus, the plating segment 164 is electrically isolated from the plating segment 166, and the plating in the through hole 162 is not continuous from the laminate 124 to the laminate 126.

The PTH 150 comprises a continuous plating 153. Since the platable dielectric layers 132 and 142 each include platable dielectric material, the plating 153 plates to the platable dielectric layers 132 and 142, and is continuous from the laminate 122 to the laminate 126.

FIG. 15 also shows lands 301–324. Although not explicitly shown, some or all of the lands 301–324 may be used to facilitate electrical connections within the substrate 20. As an example, an electrically conductive coupler 340 (e.g., electrically conductive wiring) electrically couples the land 314 to the land 315. Generally, any land may be electrically coupled to any other land or internal circuitry in the substrate 120.

In a substrate having a multisegmented PTH of the present invention, each plated segment could be used for a different purpose or function. For example, each plated segment could independently connect to wiring within the substrate. Thus, the multisegmented PTH facilitates a higher wiring density in the substrate.

The scope of the present invention includes structures with include SPC's of the first embodiments (e.g., the SPC's 30 and 40 of FIG. 9) and SPC's of the second embodiments (e.g., the SPC's 130 and 140 of FIG. 15) in the same substrate or composite PCB. The number of SPC's and laminate layers may differ from what is shown in FIGS. 9 and 15. Generally, the substrate or PCB of the present invention includes at least one SPC such that each SPC is sandwiched between two dielectric laminates. Additionally, although FIGS. 9 and 15 shows the SPC's 30 and 40 in FIG. 9, and the SPC's 130 and 140 in FIG. 15, as being symmetrically distributed in a direction 99 within the substrates 20 and 120, respectively, generally the SPC cores need not be symmetrically distributed within a substrate or PCB.

Furthermore, the electrically conductive metal plating process used in the present invention may include, as an alternative to seeding followed by electroplating, an electroless metal deposition step followed by the electroplating. Generally, metalizing a wall means forming a metal plating on the wall by any process known to one of ordinary skill in the art such as by seeding followed by electroplating or by electroless metal deposition followed by electroplating or by full build electroless plating. Also definitionally in the context of metalizing, a dielectric material that is characterized as nonplatable (or platable) is understood to be nonplatable (or platable) with respect to the metalizing.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:

a substrate including a first selective plate core (SPC) sandwiched between a first laminate and a second laminate, wherein the first laminate includes a dielectric layer, wherein the second laminate includes a dielectric layer, wherein the first SPC includes a dielectric layer having a dielectric material that is platable, wherein the first SPC further includes a cylindrical segment of a dielectric material that is nonplatable, and wherein the cylindrical segment extends through a total thickness of the first SPC; and a first through hole through the substrate, wherein the cylindrical segment circumscribes a portion of the first through hole, wherein a metal plating on a wall of the first through hole: is plated to the first laminate, is plated to the second laminate, is not plated to the first SPC, and is not continuous from the first laminate to the second laminate, and wherein the thickness of the cylindrical segment in a direction oriented parallel to the first through hole does not exceed the thickness of the dielectric layer in said direction.

2. The electrical structure of claim 1, further comprising a second through hole through the substrate, wherein a metal plating on a wall of the second through hole is continuous from the first laminate to the second laminate.

3. The electrical structure of claim 1, further comprising a third laminate and a second SPC, wherein second SPC is sandwiched between the second laminate and the third laminate, wherein the second SPC includes a dielectric layer having a platable dielectric material, and wherein the metal plating is continuous from the second laminate to the third laminate.

4. The electrical structure of claim 1, wherein the first SPC further comprises a first metal layer and a second metal layer, and wherein the nonplatable dielectric material of the cylindrical segment is sandwiched between the first metal layer and the second metal layer.

5. The electrical structure of claim 4, wherein the first metal layer includes copper, and wherein the second metal layer includes copper.

6. The electrical structure of claim 1, wherein the nonplatable dielectric material is selected from the group consisting of a fluoropolymer-glass material, a fluoropolymer-ceramic material, a fluorinated epoxy material, and a low surface energy thermoplastic material.

7. The electrical structure of claim 1, wherein the platable dielectric material is selected from the group consisting of an epoxy resin, a polyimide, a BT-epoxy, a cyanate ester, a thermoset resin, an epoxy resin having an addition, a polyimide having the addition, a BT-epoxy having the addition, a cyanate ester having the addition, a thermoset resin having the addition, and combinations thereof, and wherein the addition is selected from the group consisting of an organic particulate filler, an inorganic particulate filler, an organic fibrous reinforcement, an inorganic fibrous reinforcement, and combinations thereof.

8. The electrical structure of claim 1, wherein the thickness of the cylindrical segment in said direction is equal to the thickness of the dielectric layer in said direction.

9. An electrical structure, comprising:

a substrate including a first selective plate core (SPC) sandwiched between a first laminate and a second laminate, wherein the first laminate includes a dielectric layer, wherein the second laminate includes a dielectric layer, wherein the first SPC includes a dielectric layer having a dielectric material that is platable, wherein the first SPC further includes a cylindrical segment of a dielectric material that is nonplatable, and wherein the cylindrical segment extends through a total thickness of the first SPC; and a first through hole through the substrate, wherein the cylindrical segment circumscribes a portion of the first through hole, wherein a metal plating on a wall of the first through hole: is plated to the first laminate, is plated to the second laminate, is not plated to the first SPC, and is not continuous from the first laminate to the second laminate, and wherein no portion of the cylindrical segment extends above or below the dielectric layer.

10. An electrical structure, comprising:

a substrate including a first selective plate core (SPC) sandwiched between a first laminate and a second laminate, wherein the first laminate includes a dielectric layer, wherein the second laminate includes a dielectric layer, wherein the first SPC includes a dielectric layer having a dielectric material that is platable, wherein the first SPC further includes a cylindrical segment of a dielectric material that is nonplatable, and wherein the cylindrical segment extends through a total thickness of the first SPC; and a first through hole through the substrate, wherein the cylindrical segment circumscribes a portion of the first through hole, wherein a metal plating on a wall of the first through hole: is plated to the first laminate, is plated to the second laminate, is not plated to the first SPC, and is not continuous from the first laminate to the second laminate, wherein the cylindrical segment has a first exterior surface whose normal is oriented in a first direction parallel to the first through hole, wherein the dielectric layer has a first exterior surface whose normal is oriented in said first direction, and wherein the first exterior surface of the cylindrical segment is coplanar with the first exterior surface of the dielectric layer.

11. The electrical structure of claim 10, wherein the cylindrical segment has a second exterior surface whose normal is oriented in a second direction opposite the first direction, wherein the dielectric layer has a second exterior surface whose normal is oriented in said second direction, and wherein the second exterior surface of the cylindrical segment is coplanar with the second exterior surface of the dielectric layer.

* * * * *